(12) United States Patent
Kimura et al.

(10) Patent No.: US 11,417,575 B2
(45) Date of Patent: Aug. 16, 2022

(54) BOARD AND SEMICONDUCTOR APPARATUS

(71) Applicant: KYOCERA Corporation, Kyoto (JP)

(72) Inventors: Takayuki Kimura, Omihachiman (JP); Hisaki Masuda, Hikone (JP); Takayuki Ohyama, Higashine (JP); Yuko Tanaka, Kyoto (JP); Yoshihiro Uemura, Moriyama (JP); Hiroyuki Miura, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 69 days.

(21) Appl. No.: 17/253,670

(22) PCT Filed: Jun. 27, 2019

(86) PCT No.: PCT/JP2019/025657
§ 371 (c)(1),
(2) Date: Dec. 18, 2020

(87) PCT Pub. No.: WO2020/004566
PCT Pub. Date: Jan. 2, 2020

(65) Prior Publication Data
US 2021/0265226 A1  Aug. 26, 2021

(30) Foreign Application Priority Data
Jun. 28, 2018  (JP) .............................. JP2018-123105

(51) Int. Cl.
*H01L 23/06* (2006.01)
*H01L 23/10* (2006.01)

(52) U.S. Cl.
CPC .............. *H01L 23/06* (2013.01); *H01L 23/10* (2013.01)

(58) Field of Classification Search
CPC ................................ H01L 23/06; H01L 23/10
See application file for complete search history.

(56) References Cited

U.S. PATENT DOCUMENTS

| | | | |
|---|---|---|---|
| 2011/0048757 A1* | 3/2011 | Yamamoto | H01L 23/10 174/50.5 |
| 2017/0354049 A1* | 12/2017 | Yokota | B23K 1/00 |

FOREIGN PATENT DOCUMENTS

| | | |
|---|---|---|
| EP | 0297511 A2 | 6/1988 |
| JP | 02-056955 A | 2/1990 |
| JP | 2003-158211 A | 5/2003 |
| JP | 2005-183830 A | 7/2005 |

* cited by examiner

*Primary Examiner* — Peniel M Gumedzoe
(74) *Attorney, Agent, or Firm* — Volpe Koenig

(57) ABSTRACT

A board in an aspect of the present invention includes a substrate, a first film, a first layer, and a second film. The substrate has a first elastic modulus. The first film is at an upper surface of the substrate. The first layer is at a lower surface of the substrate. The first layer has a second elastic modulus lower than the first elastic modulus and has a first thermal expansion coefficient. The second film is at a lower surface of the first layer. The second film includes the same material as the first film and has a second thermal expansion coefficient lower than the first thermal expansion coefficient.

18 Claims, 8 Drawing Sheets

AgCu
Ni
Cu
Kov

AgCu
Cu
Kov

BOARD AND SEMICONDUCTOR APPARATUS

FIELD

The present invention relates to a board for sealing a package accommodating a semiconductor device, and relates to a semiconductor apparatus including the board.

BACKGROUND

In recent years, semiconductor packages and apparatuses accommodating semiconductor devices, such as integrated circuits (ICs), large-scale integrations (LSIs), and power devices, are to be sealed hermetically (refer to Japanese Unexamined Patent Application Publication No. 2005-183830).

Japanese Unexamined Patent Application Publication No. 2005-183830 describes a technique relating to a lid for sealing a semiconductor package. The lid includes an iron-nickel alloy substrate, a nickel layer on the upper surface of the substrate, a copper-nickel alloy layer on the lower surface of the substrate, and a silver-copper brazing material on the lower surface of the copper-nickel alloy layer. However, the lid with this structure may undergo a change in the melting point of the brazing material caused by formation of an alloy between the copper-nickel alloy layer and the brazing material under heat. The lid may not hermetically seal the semiconductor package.

BRIEF SUMMARY

A board according to one aspect of the present invention includes a substrate, a first film, a first layer, and a second film. The substrate has a first elastic modulus. The first film is at an upper surface of the substrate. The first layer is at a lower surface of the substrate. The first layer has a second elastic modulus lower than the first elastic modulus and has a first thermal expansion coefficient. The second film is at a lower surface of the first layer. The second film includes the same material as the first film and has a second thermal expansion coefficient lower than the first thermal expansion coefficient.

A semiconductor apparatus according to another aspect of the present invention includes a package accommodating a semiconductor device, and the board according to the above aspect located at an upper surface of the package.

DETAILED DESCRIPTION

A board and a semiconductor apparatus according to one or more embodiments of the present invention will now be described with reference to the drawings.

Board Structure

Figure 1:
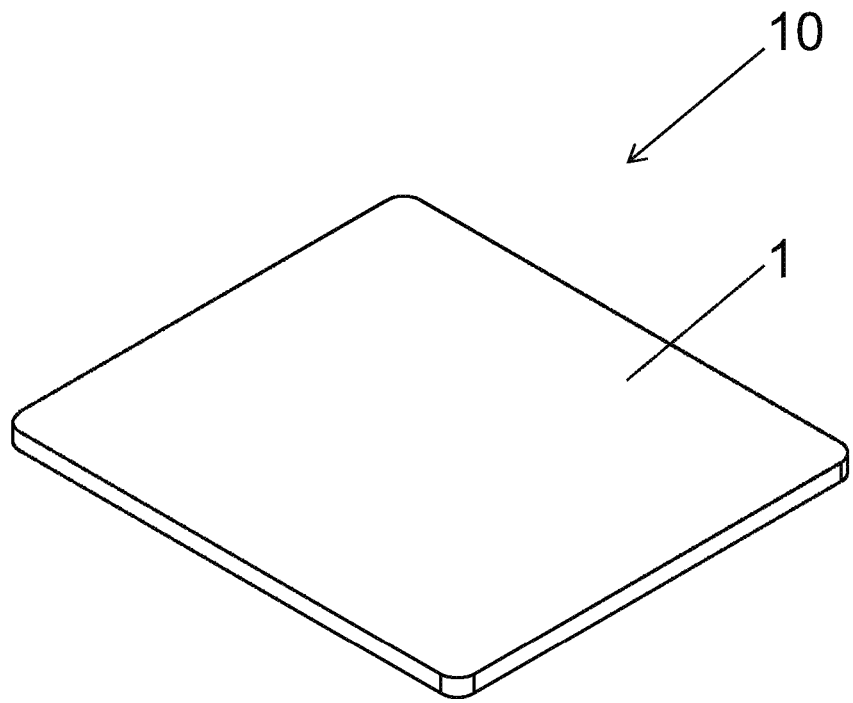
FIG. 1 is an exploded perspective view of a semiconductor apparatus according to an embodiment of the present invention.
Figure 1:
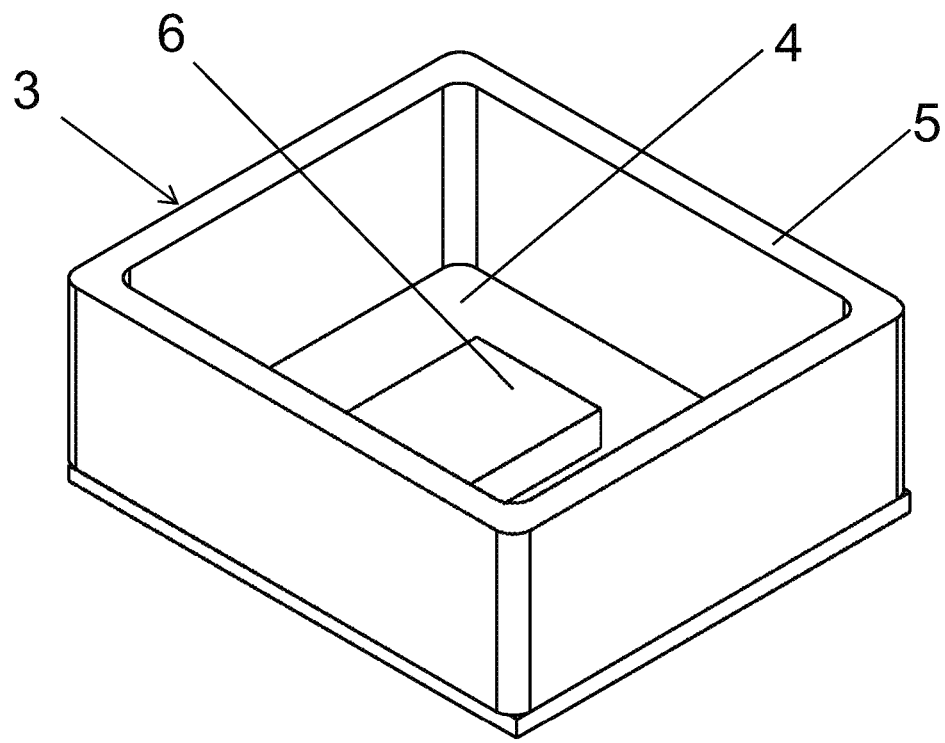
Figure 2:
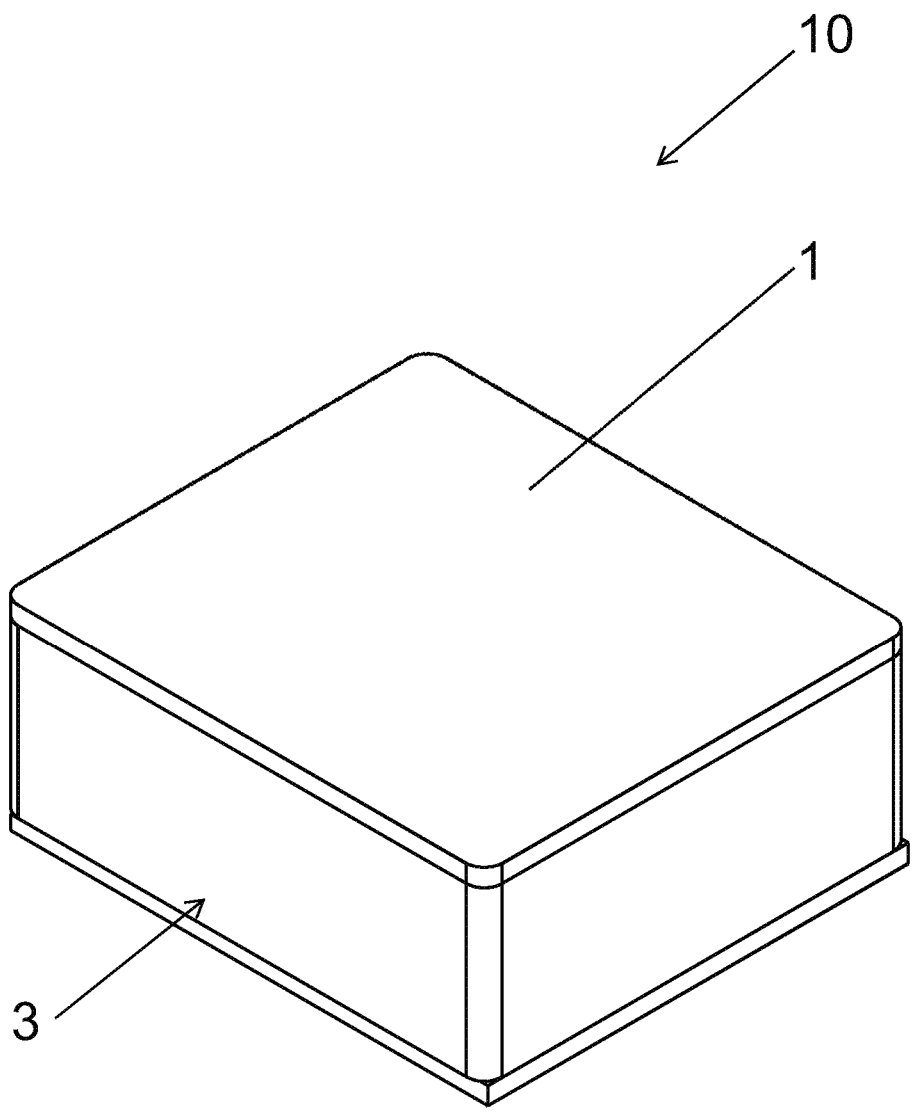
FIG. 2 is a perspective view of the semiconductor apparatus according to the embodiment of the present invention.
Figure 3:
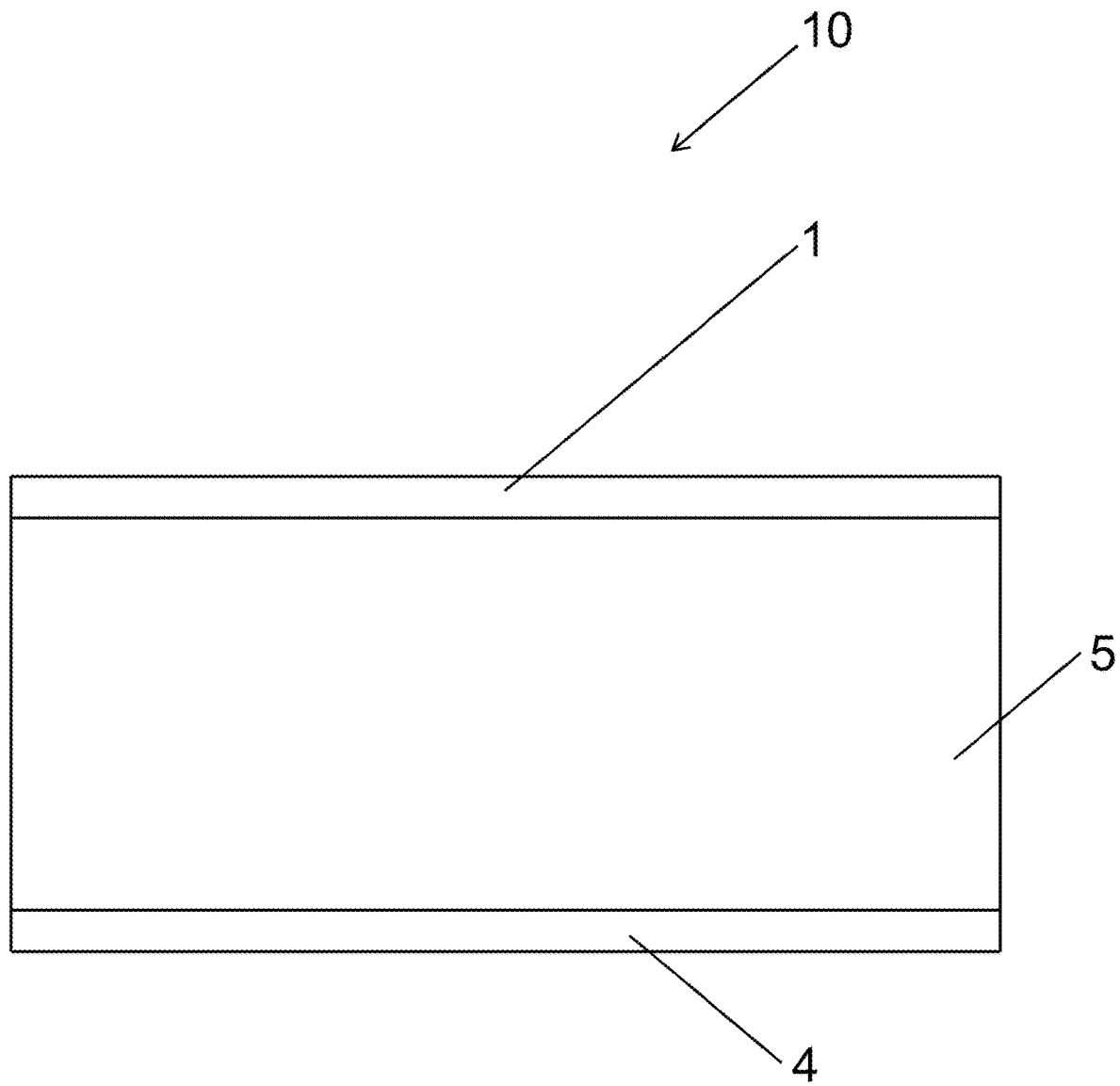
FIG. 3 is a side view of the semiconductor apparatus according to the embodiment of the present invention.
Figure 4:
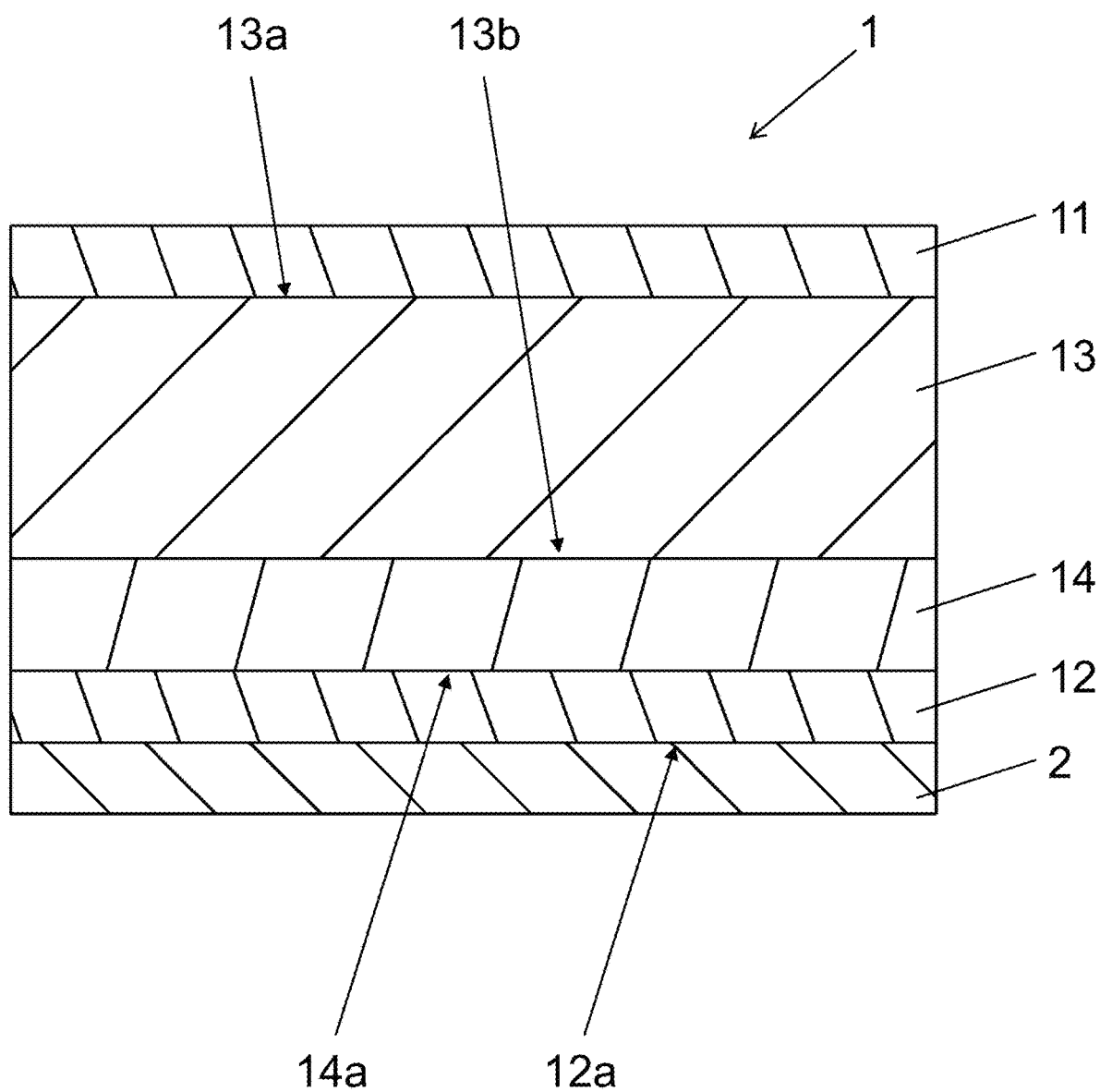
FIG. 4 is a cross-sectional view of a board according to the embodiment of the present invention.
Figure 5:
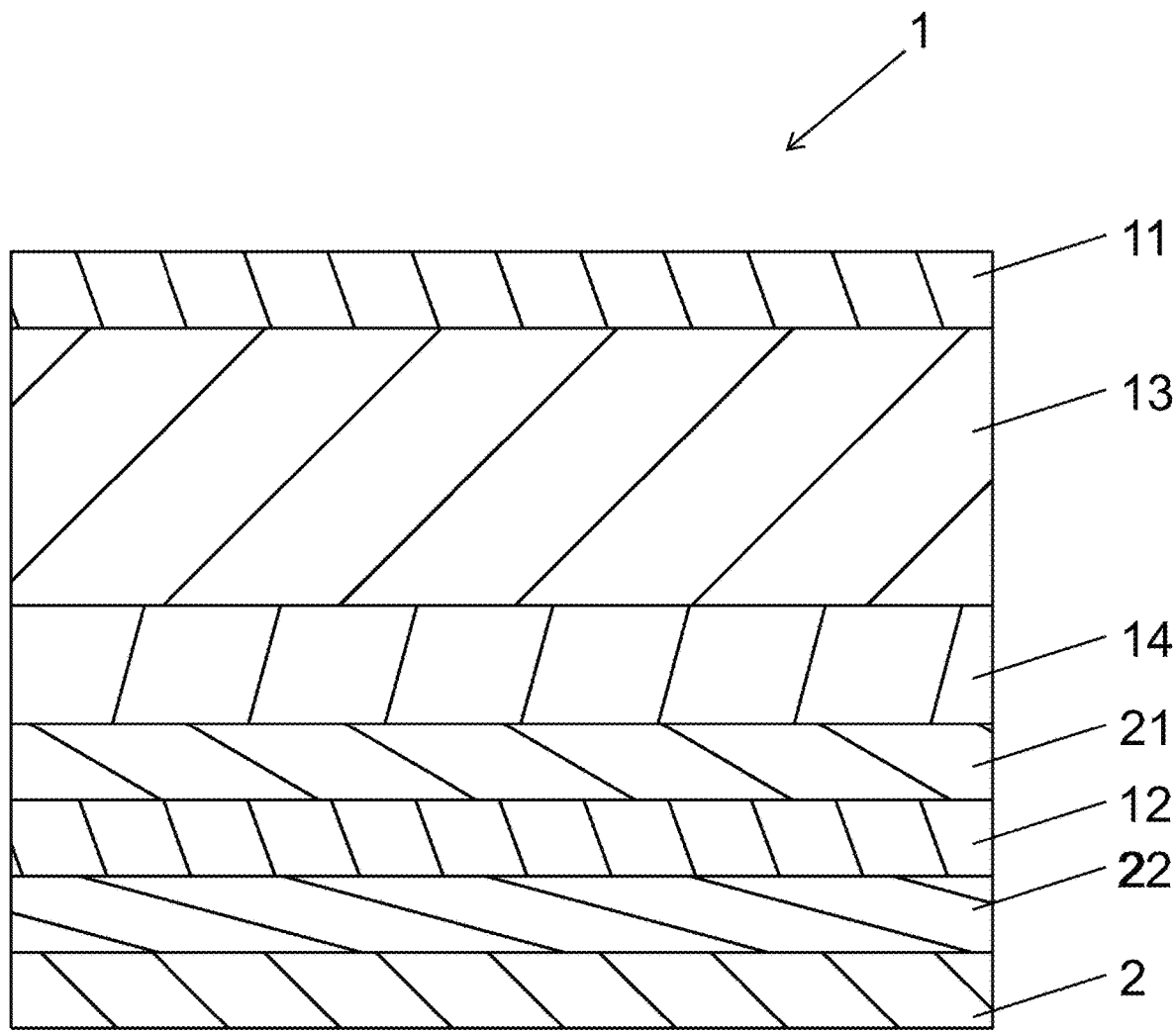
FIG. 5 is a cross-sectional view of a board according to another embodiment of the present invention.
Figure 6A:
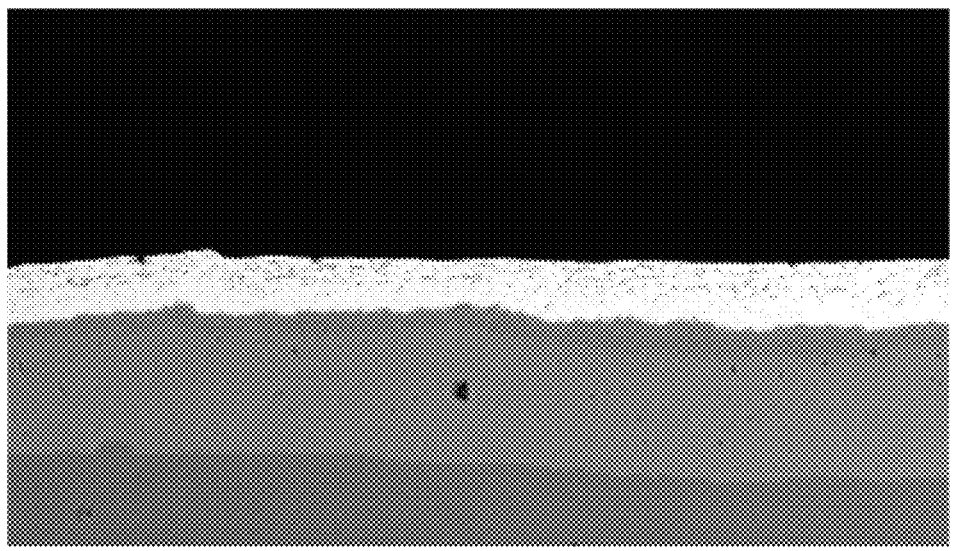
FIGS. 6A and 6B are photographs of boards according to the embodiment and another example, showing their cross sections.
Figure 6B:
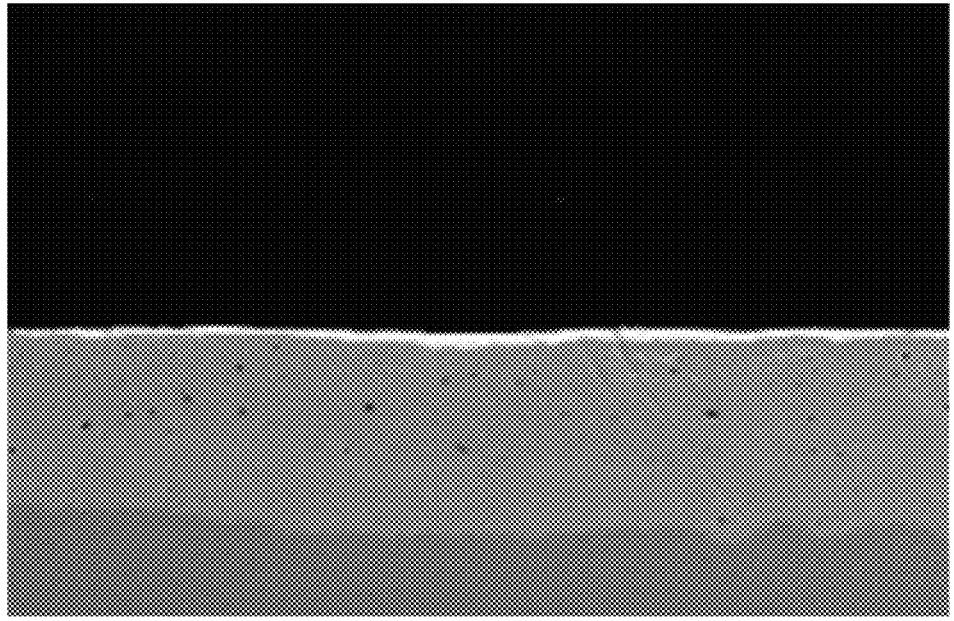
Figure 7:
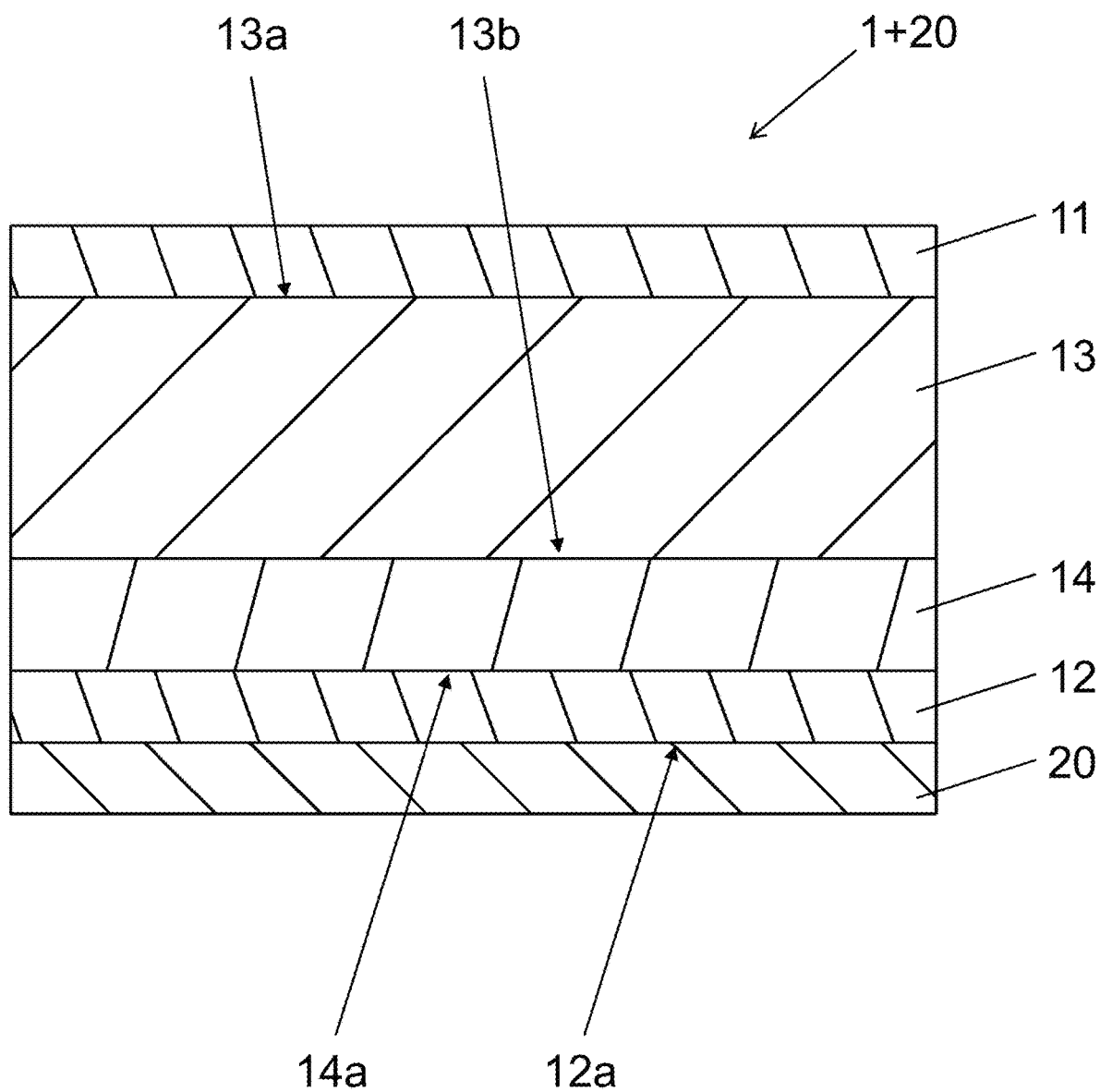
FIG. 7 is a cross-sectional view of a board with an adhesive according to an embodiment of the present invention.
Figure 8:
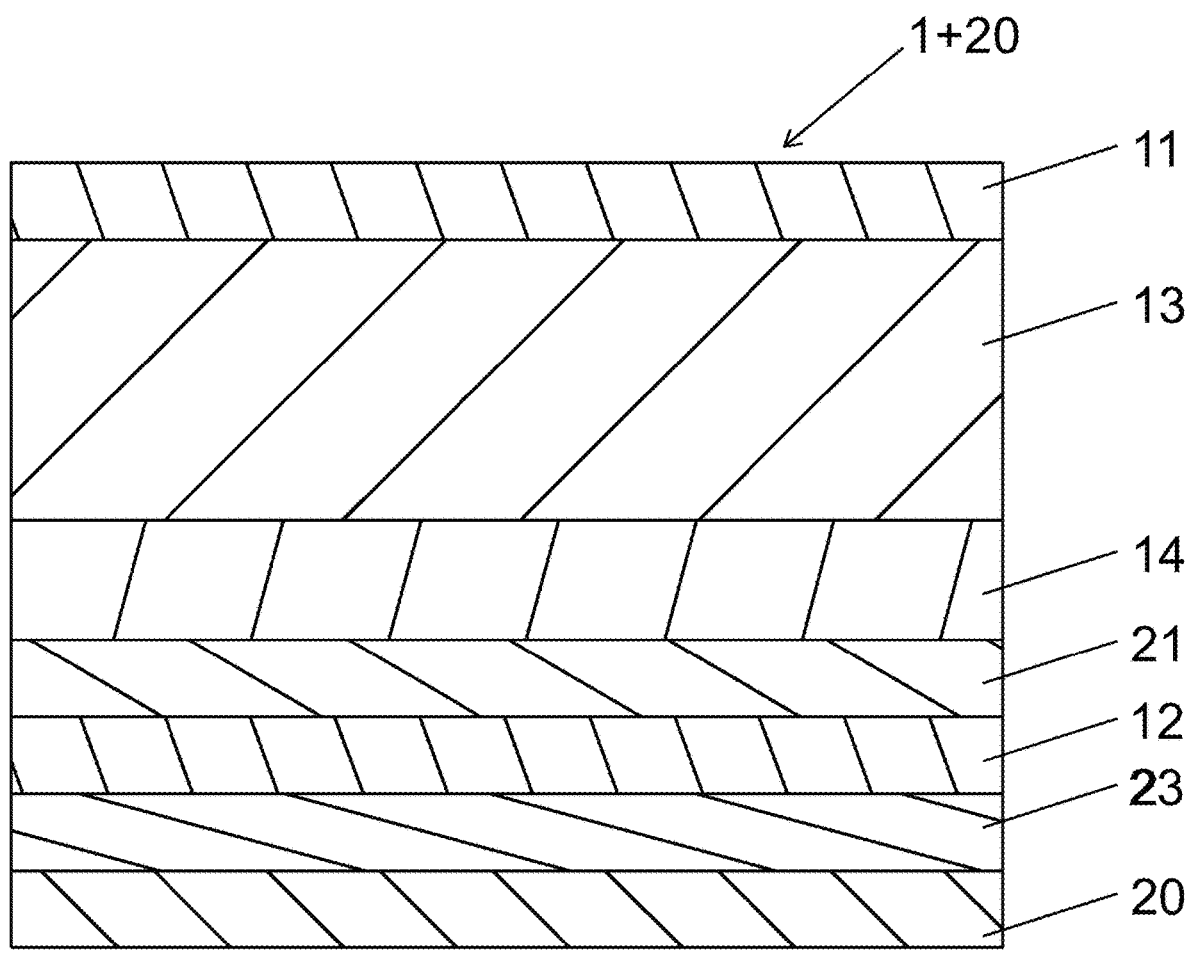
FIG. 8 is a cross-sectional view of a board with an adhesive according to another embodiment of the present invention.

FIG. 1 is an exploded perspective view of a semiconductor apparatus according to an embodiment of the present invention. FIG. 2 is a perspective view of the semiconductor apparatus according to the embodiment of the present invention. FIG. 3 is a side view of the semiconductor apparatus according to the embodiment of the present invention. FIG. 4 is a cross-sectional view of a board according to the embodiment of the present invention. FIG. 5 is a cross-sectional view of a board according to another embodiment of the present invention. FIGS. 6A and 6B are photographs of boards according to the embodiment and another example, showing their cross sections. FIG. 7 is a cross-sectional view of a board with an adhesive according to an embodiment of the present invention. FIG. 8 is a cross-sectional view of a board with an adhesive according to another embodiment of the present invention.

As illustrated, a board 1 according to the embodiment of the present invention includes a substrate 13, a first film 11, a first layer 14, and a second film 12. The board 1 can be used as a lid for sealing a semiconductor device accommodated in a semiconductor apparatus 10 (described later).

The board 1 may have the same dimensions as the outer edge of a frame 5 (described later) and may have dimensions of 5×5 mm to 50×50 mm as viewed from above. The board 1 has a thickness of, for example, 0.05 to 5 mm.

As shown in FIG. 4, the board 1 includes the substrate 13, the first film 11, the first layer 14, and the second film 12. The substrate 13 contains, for example, an iron-nickel alloy. In some embodiments, the substrate 13 may contain an iron-nickel-cobalt alloy. The substrate 13 has a thickness of, for example, 0.03 to 4 mm. The substrate 13 has a first elastic modulus (Young's modulus) of, for example, 120 to 140 GPa.

The first film 11 is located at an upper surface 13a of the substrate 13. The first film 11 protects the surface of the substrate 13 from oxidation and rust. The substrate 13 and the first film 11 may be separated by another layer and/or another film. The first film 11 contains, for example, nickel. In some embodiments, the first film 11 may contain gold with an antioxidant effect. The first film 11 has a thickness of, for example, 0.002 to 0.02 mm.

The first layer 14 is located at a lower surface 13b of the substrate 13. The first layer 14 contains, for example, copper. In some embodiments, the first layer 14 may contain a metal with a relatively low elastic modulus, such as silver. The first layer 14 may include a base layer formed from copper, and a Ni layer deposited on the base layer. In other words, the Ni layer may be located at the lower surface 13b of the substrate 13. The substrate 13 and the first layer 14 may be separated by another layer and/or another film. The first layer 14 has a thickness of, for example, 0.01 to 1 mm. The first layer 14 may contain a metal material to have a second elastic modulus lower than the first elastic modulus of the substrate 13. The second elastic modulus is, for example, 105 to 115 GPa. With the first layer 14 having a lower elastic modulus than the substrate 13, or in other words, with the second elastic modulus being lower than the first elastic modulus, the board 1 undergoes less deformation caused by thermal stress under heat when the board 1 is joined to a package 3 (described later). Thus, the board 1 can be joined to the package 3 with smaller pressure through, for example, welding, thus reducing a load on the package 3. This reduces mechanical loss such as cracks in the board 1 and the package 3. The first layer 14 has a first thermal expansion coefficient of, for example, 16 to $17\times10^{-6}$/K (m).

The second film 12 is located at a lower surface 14a of the first layer 14. The second film 12 contains, for example, nickel. In some embodiments, the second film 12 may contain gold. The first layer 14 and the second film 12 may be separated by another layer and/or another film. The second film 12 has a thickness of, for example, 0.002 to 0.02 mm. The second film 12 may contain the same material as the first film 11. With the second film 12 containing the same material as the first film 11, the substrate 13 and the first layer 14 are sandwiched between the films having thermal expansion coefficients similar to or equal to each other when the board 1 is heated. This reduces tensile stress caused by the difference in thermal expansion between the substrate 13 and the first layer 14, thus reducing deformation of the board 1 under heat. The second film 12 has a lower thermal expansion coefficient than the first layer 14. In other words, the second film 12 has a second thermal expansion coefficient lower than the first thermal expansion coefficient. The second thermal expansion coefficient is, for example, 11 to $12\times10^{-6}$/K (m). This reduces deformation of the board 1 caused by thermal expansion of the first layer 14 under heat.

The board 1 according to the embodiment of the present invention with the above structure undergoes less deformation under heat. The board 1 as a lid can thus seal a semiconductor apparatus and maintain a tight seal.

The board 1 according to the embodiment of the present invention with the above structure may have the advantages described below when, for example, exposed to heat during baking. The board 1 in an example is rectangular and has a ratio of the long side to the short side of 3:2. The board 1 was baked for 30 minutes at a temperature of 400° C. A board used in a comparative example was prepared under the same conditions as described above but includes no second film 12. As compared with the board with no second film 12, the board 1 had a warpage (deformation) about ⅙ to 1/10 along the short side, about ½ to ⅓ along the long side, and about ⅓ to ⅕ diagonally.

The board 1 with the substrate 13 as its major part containing an iron-nickel alloy has a relatively high elastic modulus and a relatively low thermal expansion coefficient. This can effectively reduce deformation of the board 1 under heat.

For example, when the board 1 is joined to a ceramic semiconductor package with a brazing material under heat, the first layer 14 containing copper, which has a relatively low elastic modulus, serves as a buffer between the substrate 13 and the semiconductor package having a relatively high elastic modulus. This reduces cracks in the substrate 13 and the semiconductor package.

The first film 11 and the second film 12 each containing nickel effectively protect the upper surface of the board 1 from oxidation and other corrosion, and also allow the substrate 13 and the first layer 14 to be sandwiched between the films having thermal expansion coefficients similar to or equal to each other. This effectively reduces warpage or other deformation of the board 1 caused by the difference in thermal expansion between the substrate 13 and the first layer 14 under heat.

When the board 1 is joined to the package with a bond such as a silver brazing material, the second film 12 containing nickel reduces the likelihood that copper in the first layer 14 and copper in the bond 2 bind together under heat. This structure reduces formation of a copper alloy under heat and thus reduces a change in the melting point of the bond 2, as compared with the board with no second film 12.

The board 1 may incorporate the bond 2 that is an adhesive 20 at a lower surface 12a of the second film 12. The bond 2 can join the package 3 and the board 1 together to form the semiconductor apparatus 10 (described later). The adhesive 20 may be the bond 2 incorporated in the board 1, or may be located at an upper surface of the package 3. In some embodiments, the adhesive 20 may be a separate layer located between the package 3 and the board 1. The board 1 incorporating the bond 2 can be joined as a lid to, for example, the package of the semiconductor apparatus without separate preparation of a bond, and thus has higher productivity. The bond 2 contains, for example, a silver-copper brazing material. In some embodiments, the bond 2 may be a low-melting-point brazing material formed from Au—Sn or a lead-free solder formed from Sn—Ag—Cu. The bond 2 has a thickness of, for example, 0.05 to 0.5 mm. The bond 2 may be any material that can join metal materials together. In some embodiments, the adhesive 20 may be a layer separate from the board 1, rather than being the bond 2 in the board 1. The bond 2 may be eliminated. The adhesive 20 may use the same material as or a different material from the bond 2.

When the bond 2 contains silver-copper, the second film 12 containing nickel reduces formation of a copper alloy under heat and thus reduces a change in the melting point of the bond 2, as compared with the board with no second film 12.

FIG. 6A is a photograph of the board according to the embodiment shown in FIG. 4 fired at 850° C. for about two minutes in a firing furnace, showing its cross section. The substrate 13 is formed from Kovar, the first layer 14 is formed from Cu, the second film 12 is formed from Ni, and the bond 2 is formed from AgCu. FIG. 6B is a photograph of a board with no second film 12 according to a comparative example. In FIG. 6A, the Ni layer as the second film 12 completely separates AgCu and Cu from each other. The second film 12 containing Ni is between the bond 2 containing AgCu and the first layer 14 containing Cu to block AgCu from eroding Cu. In FIG. 6B, AgCu has eroded and mixed with Cu. This may change the melting point of AgCu and cause unevenness in joining between the board and the package, failing to maintain a tight joint. The experiments clearly reveal that the board 1 with the second film 12 including Ni allows tighter joining than the board with no second film 12.

Package Structure

FIGS. 1 to 3 show the semiconductor apparatus 10. FIGS. 7 and 8 are cross-sectional views of examples of the board 1 with the adhesive 20 as a layer separate from the board 1. In each of these figures, the package 3 includes a mounting board 4, a frame 5, and a board (lid) 1.

The mounting board 4 is a rectangular plate as viewed from above. The mounting board 4 has an upper surface including a mount area at the center for receiving a semiconductor device 6. As shown in FIG. 1, the mounting board 4 is electrically connected to the semiconductor device 6 near the mount area on the upper surface. The mount area is defined by the surrounding rectangular frame 5 in the mounting board 4 as viewed from above to receive the semiconductor device 6.

The mounting board 4 may be an insulator formed from, for example, a ceramic material, such as sintered aluminum oxide, sintered mullite, sintered silicon carbide, sintered aluminum nitride, sintered silicon nitride, or glass ceramic. The mounting board 4 is not limited to such ceramic materials. For example, the mounting board 4 may contain a resin material such as an epoxy resin, a polyimide resin, or a polyamide resin, or may contain a composite material including any of these resin materials with glass cloth, inorganic filler, or other additives. For example, the mounting board 4 has dimensions of 5×5 mm to 50×50 mm as viewed from above, and has a thickness of 0.3 to 3 mm. The mounting board 4 containing a metal material can efficiently dissipate heat generated by the semiconductor device 6 out of the package 3.

The frame 5 is located at the upper surface of the mounting board 4. The frame 5 defines a space for accommodating the semiconductor device 6. The frame 5 surrounds the mount area. The frame 5 has rectangular outer and inner edges as viewed from above. The rectangular frame 5 has sides parallel to the corresponding sides of the mounting board 4. In some embodiments, the frame 5 may include a metal layer on the upper surface or the surface to face the lid 1. In some embodiments, the frame 5 may be integral with the mounting board 4. In this case, the frame 5 formed from a ceramic material may be placed at the upper surface of the mounting board 4 and fired together with the mounting board 4. In some embodiments, the frame 5 may be formed at the upper surface of the mounting board 4 as a member separate from the mounting board 4. In this case, the mounting board 4 is formed from a ceramic material and has the upper surface coated with a metal layer. The frame 5 is formed from a ceramic material and has the lower surface coated with a metal layer. The frame 5 and the mounting board 4 may be joined together with a bond, such as a low-melting-point brazing material formed from Au—Sn, between the metal layer at the upper surface of the mounting board 4 and the metal layer at the lower surface of the frame 5.

The frame 5 is formed from, for example, a metal material such as iron, copper, nickel, chromium, cobalt, or tungsten, or an alloy of any of these metals. For example, the frame 5 has dimensions of 5×5 mm to 50×50 mm as viewed from above, and has a thickness of 0.5 to 2 mm. The frame 5 has a height of, for example, 1 to 10 mm.

The board (lid) 1 is joined to the upper surface of the frame 5 with the bond 2, such as a brazing material or solder, to cover the frame 5. The board 1 is rectangular as viewed from above, and includes, on the lower surface or the surface to face the frame 5, a joint area to be joined to the upper surface of the frame 5 facing the board 1.

The package 3 according to the embodiment of the present invention with the above structure can maintain a tight seal.

Method for Manufacturing Package and Board

A method for manufacturing the package 3 according to the embodiment of the present invention will now be described.

The mounting board 4 formed from, for example, sintered aluminum oxide may be prepared through the processes described below. First, raw material powder of, for example, aluminum oxide and silicon oxide is formed into a sheet with an appropriate organic binder and an appropriate organic solvent to obtain a rectangular ceramic green sheet. A stack of multiple ceramic green sheets is then prepared. In some embodiments, the mounting board 4 may be formed from a single ceramic green sheet instead of a stack of multiple ceramic green sheets when the single ceramic green sheet can provide, for example, satisfactory mechanical strength of the mounting board 4. The ceramic green sheets are then fired at temperatures of 1300 to 1600° C. This completes the mounting board 4.

The frame 5 formed from, for example, sintered aluminum oxide may be prepared in the same manner as the mounting board 4 described above. First, raw material powder of, for example, aluminum oxide and silicon oxide is formed into a sheet with an appropriate organic binder and an appropriate organic solvent to obtain a rectangular ceramic green sheet. A stack of multiple ceramic green sheets is then prepared. The stack is then punched to form a frame having a through-hole at the center. A metal paste as a precursor of a metal layer is further printed on the upper surface of the stack by, for example, screen printing. The metal paste is prepared by mixing tungsten powder with an organic solvent and an organic binder. The stack is then fired at temperatures of 1300 to 1600° C. to form the frame 5. In some embodiments, the frame 5 may be formed from a single ceramic green sheet instead of a stack of multiple ceramic green sheets when the single ceramic green sheet can provide, for example, satisfactory mechanical strength of the frame 5. The frame 5 is then joined to the upper surface of the mounting board 4 with a bond, such as a glass bond or a resin bond. In some embodiments, the frame 5 and the mounting board 4 may be formed from the same or similar sintered aluminum oxide. In this case, ceramic green sheets in the shape of the frame may be stacked on the upper surface of a ceramic green sheet of the mounting board 4, and these ceramic green sheets may then be fired together to integrally form the frame 5 and the mounting board 4.

For example, the board 1 may include the substrate 13 formed from an iron-nickel-cobalt alloy, the first film 11 and the second film 12 each formed from nickel, the first layer 14 formed from copper, and the bond 2 formed from a silver-copper brazing material. In this case, the first film 11, the substrate 13, the first layer 14, the second film 12, and the bond 2 are stacked in this order. These stacked layers are welded together with pressure, using a pressure welding machine, into a clad material and then cut into a predetermined size. To obtain the board 1 having a predetermined thickness, the materials of the layers have predetermined thicknesses reflecting their compression rates. In some embodiments, an iron-nickel-cobalt alloy and copper are welded together with pressure into a clad material. The clad material is then cut into a predetermined size and plated with nickel at the upper and lower surfaces. Further, the bond 2, such as a silver-copper brazing material, may be located on the second film 12 or a nickel film. In this case, the bond 2 may be placed under the nickel film and then melted and joined to the nickel film in, for example, a firing furnace.

Semiconductor Apparatus Structure

FIGS. 1 to 3 show the semiconductor apparatus 10 according to the embodiment of the present invention. In these figures, the semiconductor apparatus 10 includes the package 3 according to the embodiment of the present invention, and also includes the board (lid) 1 and the semiconductor device 6.

The semiconductor apparatus 10 according to the embodiment of the present invention is completed by mounting the semiconductor device 6 on the mount area on the package 3 described above and electrically connecting the semiconductor device 6 to a first electrode included in the package 3. The semiconductor device 6 is mounted on a metal part on the mount area with a bond, such as a low-melting-point brazing material formed from Au—Sn or a lead-free solder formed from Sn—Ag—Cu. Examples of the semiconductor device 6 include an integrated circuit (IC), a large-scale integration (LSI), and a semiconductor device for a power device.

In the semiconductor apparatus 10, the board 1 is joined and fixed, as a lid, to the upper surface of the frame 5 to seal the semiconductor device 6 mounted on the mount area. The joint area on the lid 1 is joined to the upper surface of the frame 5 with the adhesive 20 or with the adhesive 20 including the bond 2. The adhesive 20 may be, for example, a silver-copper material described above, or may be a low-melting-point brazing material formed from Au—Sn or a lead-free solder formed from Sn—Ag—Cu.

The adhesive 20 containing silver and copper and the second film 12 formed from a metal such as nickel can easily form a second alloy layer 22. This thus reduces the likelihood that the material of the first layer 14 and the material of the adhesive 20 bind together under heat during joining, as described above.

The board 1 may be joined to the frame 5 of the package 3 with the adhesive 20 by, for example, seam welding. In this case, the board 1 is locally heated and easily undergoes thermal expansion and contraction. In the board 1 including the first layer 14 containing a metal material and the second film 12 containing a metal material under the first layer 14, a first alloy layer 21 forms between the first layer 14 and the second film 12 under heat during, for example, welding. As shown in FIGS. 5 and 8, the first alloy layer 21 between the first layer 14 and the bond 2 (adhesive 20) reduces the likelihood that the material of the first layer 14 and the material of the bond 2 (adhesive 20) bind together under heat during joining. This reduces a change in the melting point of the bond 2 and thus reduces, for example, unevenness in the joining state in welding.

In the board 1 including the second film 12 containing a metal material and the bond 2 containing a metal material under the second film 12, the second alloy layer 22 forms between the second film 12 and the bond 2 under heat during, for example, welding. As shown in FIG. 5, the second alloy layer 22 between the first layer 14 and the bond 2 reduces the likelihood that the material of the first layer 14 and the material of the bond 2 bind together under heat during joining. This reduces a change in the melting point of the bond 2 and thus reduces, for example, unevenness in the joining state in welding.

The bond 2 containing silver and copper and the second film 12 formed from a metal such as nickel can easily form the second alloy layer 22. As described above, this reduces the likelihood that the material of the first layer 14 and the material of the bond 2 bind together under heat during joining.

Also, in the semiconductor apparatus 10 including the second film 12 containing a metal material and the adhesive 20 containing a metal material under the second film 12, a third alloy layer 23 forms between the second film 12 and the adhesive 20 under heat during, for example, welding. As shown in FIG. 8, the third alloy layer 23 between the first layer 14 and the adhesive 20 reduces the likelihood that the material of the first layer 14 and the material of the adhesive 20 bind together under heat during joining. This reduces a change in the melting point of the adhesive 20 and thus reduces, for example, unevenness in the joining state in welding.

The adhesive 20 containing silver and copper and the second film 12 formed from a metal such as nickel can easily form the third alloy layer 23. As describe above, this reduces the likelihood that the material of the first layer 14 and the material of the adhesive 20 bind together under heat during joining.

The present invention is not limited to the above embodiments and examples but may be modified variously without departing from the spirit and scope of the present invention.

REFERENCE SIGNS LIST 1 board (lid)
11 first film
12 second film
13 substrate
14 first layer
21 first alloy layer
22 second alloy layer
23 third alloy layer
20 adhesive
2 bond
3 package
4 mounting board
5 frame
6 semiconductor device
10 semiconductor apparatus

The invention claimed is:

1. A board, comprising:
a substrate having a first elastic modulus;
a first film at an upper surface of the substrate;
a first layer at a lower surface of the substrate, the first layer having a second elastic modulus lower than the first elastic modulus and having a first thermal expansion coefficient; and
a second film at a lower surface of the first layer, the second film comprising the same material as the first film and having a second thermal expansion coefficient lower than the first thermal expansion coefficient.

2. The board according to claim 1, wherein
the substrate comprises an iron-nickel alloy.

3. The board according to claim 1, wherein
the first layer comprises copper.

4. The board according to claim 1, wherein
the first film comprises nickel, and the second film comprises nickel.

5. The board according to claim 1, wherein
the first layer comprises a metal material, and the second film comprises a metal material, and
the board further comprises, between the first layer and the second film, a first alloy layer comprising an alloy of the metal material in the first layer and the metal material in the second film.

6. The board according to claim 1, further comprising:
a bond at a lower surface of the second film.

7. The board according to claim 6, wherein
the bond comprises silver and copper.

8. The board according to claim 6, wherein
the second film comprises a metal material, and the bond comprises a metal material, and the board further comprises, between the second film and the bond, a second alloy layer comprising an alloy of the metal material in the second film and the metal material in the bond.

9. The board according to claim 8, wherein the bond comprises silver and copper.

10. A semiconductor apparatus, comprising:
a package accommodating a semiconductor device;
the board according to claim 1 located at an upper surface of the package; and
an adhesive located between and joining the package and the board.

11. A semiconductor apparatus, comprising:
a package accommodating a semiconductor device; and
the board according to claim 1 located at an upper surface of the package.

12. The semiconductor apparatus according to claim 10, wherein
the adhesive comprises silver and copper.

13. The semiconductor apparatus according to claim 12, wherein
the second film comprises a metal material, and the adhesive comprises a metal material, and
the semiconductor apparatus further comprises, between the second film and the adhesive, a third alloy layer comprising an alloy of the metal material in the second film and the metal material in the adhesive.

14. The board according to claim 1, wherein
the first layer comprises copper, and
the first film comprises nickel, and the second film comprises nickel.

15. The board according to claim 14, wherein
the first layer comprises a metal material, and the second film comprises a metal material, and
the board further comprises, between the first layer and the second film, a first alloy layer comprising an alloy of the metal material in the first layer and the metal material in the second film.

16. The board according to claim 1, wherein
the first film and the second film are separated from each other.

17. The board according to claim 1, wherein
a first thickness of the substrate is larger than a second thickness of the first layer.

18. The board according to claim 17, wherein
a third thickness of the first film and a fourth thickness of the second film are smaller than the first thickness and the second thickness.

\* \* \* \* \*